United States Patent
Liu et al.

(10) Patent No.: US 11,115,005 B2
(45) Date of Patent: Sep. 7, 2021

(54) RING VOLTAGE CONTROLLED OSCILLATOR (VCO) STARTUP HELPER CIRCUIT

(71) Applicant: Samsung Electronics Co., Ltd., Gyeonggi-do (KR)

(72) Inventors: Xiong Liu, Cupertino, CA (US); Chih-Wei Yao, Saratoga, CA (US)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 16/835,778

(22) Filed: Mar. 31, 2020

(65) Prior Publication Data

US 2021/0067145 A1   Mar. 4, 2021

Related U.S. Application Data

(60) Provisional application No. 62/892,862, filed on Aug. 28, 2019.

(51) Int. Cl.
| | | |
|---|---|---|
| *H03K 3/03* | (2006.01) | |
| *H03L 3/00* | (2006.01) | |
| *H03K 3/012* | (2006.01) | |
| *H03L 7/099* | (2006.01) | |
| *H03L 7/197* | (2006.01) | |

(Continued)

(52) U.S. Cl.
CPC ........... *H03K 3/0315* (2013.01); *H03K 3/012* (2013.01); *H03K 3/0322* (2013.01); *H03L 3/00* (2013.01); *H03L 7/0995* (2013.01); *H03L 7/1974* (2013.01); *H04B 1/16* (2013.01); *H04L 7/0331* (2013.01); *H03B 2200/0094* (2013.01)

(58) Field of Classification Search
CPC .. H03B 5/06; H03B 2200/0094; H03K 3/012; H03K 3/0315; H03K 3/0322; H03L 3/00
USPC .......................................................... 331/57
See application file for complete search history.

(56) References Cited

U.S. PATENT DOCUMENTS

| | | | |
|---|---|---|---|
| 5,357,217 A | 10/1994 | Marchesi et al. | |
| 6,008,700 A * | 12/1999 | Pietrzyk | H03K 3/0315 331/179 |
| 6,317,008 B1 | 11/2001 | Gabara | |

(Continued)

FOREIGN PATENT DOCUMENTS

EP    0 601 780    4/1999

OTHER PUBLICATIONS

X. Gao, et al., "A 2.2GHz 7.6mW Sub-Sampling PLL with -126dBc/Hz In-Band Phase Noise and 0.15psrms Jitter in 0.18 μm CMOS," ISSCC Dig. Tech. Papers, pp. 392-393, Feb. 2009.

(Continued)

*Primary Examiner* — Levi Gannon
(74) *Attorney, Agent, or Firm* — The Farrell Law Firm, P.C.

(57) ABSTRACT

A ring voltage controlled oscillator (VCO) circuit is herein provided. According to one embodiment, a ring VCO circuit includes a plurality of stages connected in series, wherein each stage includes a first inverter, a second inverter, a third inverter and a fourth inverter, the first inverter connected in parallel with the third and fourth inverters and the second inverter connected in parallel with the third and fourth inverters, and a first biasing resistor connected to a first node and coupled to an input of the first inverter. The first biasing resistor includes a first switch configured to set the first biasing resistor to about zero voltage.

4 Claims, 9 Drawing Sheets

(51) Int. Cl.
    *H04B 1/16*     (2006.01)
    *H04L 7/033*     (2006.01)

(56) References Cited

U.S. PATENT DOCUMENTS

| | | | | |
|---|---|---|---|---|
| 6,515,550 | B2 | 2/2003 | Demsky et al. | |
| 7,321,269 | B2 | 1/2008 | Drake et al. | |
| 7,394,325 | B2 | 7/2008 | Ueno | |
| 7,612,621 | B2 * | 11/2009 | Kim | H03K 5/13 |
| | | | | 327/156 |
| 9,041,443 | B2 | 5/2015 | Jang et al. | |
| 9,755,574 | B2 | 9/2017 | Chatwin | |
| 2002/0113660 | A1 * | 8/2002 | Dally | H03L 7/0805 |
| | | | | 331/135 |
| 2003/0112082 | A1 * | 6/2003 | Carballo | H03K 3/0322 |
| | | | | 331/57 |
| 2008/0315966 | A1 * | 12/2008 | Lu | H03K 3/0322 |
| | | | | 331/167 |
| 2009/0251225 | A1 * | 10/2009 | Chen | H03L 7/093 |
| | | | | 331/1 A |
| 2009/0261911 | A1 * | 10/2009 | Watanabe | H03K 3/0315 |
| | | | | 331/57 |
| 2011/0007615 | A1 * | 1/2011 | Fujiwara | H03K 3/0315 |
| | | | | 369/47.48 |
| 2014/0240053 | A1 * | 8/2014 | Huang | H03L 1/00 |
| | | | | 331/34 |
| 2016/0006420 | A1 * | 1/2016 | Lin | H03B 27/00 |
| | | | | 331/57 |
| 2019/0068174 | A1 * | 2/2019 | Lu | H03K 3/0322 |
| 2019/0115925 | A1 * | 4/2019 | Shu | H03L 7/0996 |

OTHER PUBLICATIONS

S. Choi, et al., "A PVT-Robust and Low-Jitter Ring-VCO-Based Injection-Locked Clock Multiplier With a Continuous Frequency-Tracking Loop Using a Replica-Delay Cell and a Dual-Edge Phase Detector," IEEE J. Solid-State Circuits, vol. 51, No. 8, pp. 1878-1889, 2016.

W. Deng et al., "A fully synthesizable all-digital PLL with interpolative phase coupled oscillator current-output DAC and fine-resolution digital varactor using gated edge injection technique", IEEE J. Solid-State Circuits, vol. 50, No. 1, pp. 68-80, 2015.

G. Marucci, et al. "A 1.7 GHz MDLL-based fractional-N frequency synthesizer with 1.4 ps RMS integrated jitter and 3 mW power using a 1b TDC", ISSCC Dig. Tech. Papers, pp. 360-361, Feb. 2014.

J. Chien et al., "A pulse-position-modulation phase-noise-reduction technique for a 2-to-16 GHz injection-locked ring oscillator in 20 nm CMOS," ISSCC Dig. Tech. Papers, pp. 52-53, Feb. 2014.

Zhang, Hui et al., "Start-up Analysis for Differential Ring Oscillator with Even Number of Stages", Copyright 2010 IEEE, pp. 636-639.

* cited by examiner

RING VOLTAGE CONTROLLED OSCILLATOR (VCO) STARTUP HELPER CIRCUIT

PRIORITY

This application is based on and claims priority under 35 U.S.C. § 119(e) to U.S. Provisional Patent Application filed on Aug. 28, 2019 in the United States Patent and Trademark Office and assigned Ser. No. 62/892,862, the entire contents of which are incorporated herein by reference.

FIELD

The present disclosure generally relates to electronic circuits. In particular, the present disclosure relates to a ring voltage controlled oscillator (VCO) startup helper circuit.

BACKGROUND

A ring VCO is typically an electronic device having a number of inverter stages connected in series where an output of the last stage inverter is fed back to an input of the first inverter stage. Each inverter output oscillates between two voltage levels. In particular, a differential ring VCO includes a number of differential stages connected together to form a feedback loop. One differential stage has two differential inputs (INP/INN) and two differential outputs (OUTP/OUTN). Differential signals refer to the signals that have time domain waveform in complementary shapes, i.e. when one signal rise, the other signal fall, etc. One differential stage typically consists of two main inverters (INP->OUTN) and (INN->OUTP) situated between the two differential inputs and two outputs. There are two auxiliary inverters (OUTP->OUTN and OUTN->OUTP) to keep the output differential (when OUTP is high, OUTN is low, etc. Such a differential ring VCO typically relies on a large inverter size ratio between a main inverter and an auxiliary inverter of each differential stage to ensure startup. Such a configuration may increase loading and power consumption.

SUMMARY

According to one embodiment, a ring VCO circuit includes a plurality of stages connected in series, wherein each stage includes a first inverter, a second inverter, a third inverter and a fourth inverter, the first inverter connected in parallel with the third and fourth inverters and the second inverter connected in parallel with the third and fourth inverters, and a first biasing resistor connected to a first node and coupled to an input of the first inverter. The first biasing resistor includes a first switch configured to set the first biasing resistor to about zero voltage.

According to one embodiment, a ring VCO circuit includes a plurality of stages connected in series, wherein each stage includes a first inverter, a second inverter, a third inverter and a fourth inverter, the first inverter connected in parallel with the third and fourth inverters and the second inverter connected in parallel with the third and fourth inverters, and a first biasing resistor connected to an input of the first inverter and an output of the first inverter, providing a resisting bias for a first node associated with the first inverter.

According to one embodiment, a ring VCO circuit includes a plurality of stages connected in series, wherein each stage includes a first inverter, a second inverter, a third inverter and a fourth inverter, the first inverter connected in parallel with the third and fourth inverters and the second inverter connected in parallel with the third and fourth inverters, and a first biasing resistor connected to an input of the first inverter and an output of the second inverter, providing a resisting bias associated with a node of the second inverter.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of the addition of one or more other features, numerals, steps, operations, structural elements, parts, or combinations thereof.

Unless defined differently, all terms used herein have the same meanings as those understood by a person skilled in the art to which the present disclosure belongs. Terms such as those defined in a generally used dictionary are to be interpreted to have the same meanings as the contextual meanings in the relevant field of art, and are not to be interpreted to have ideal or excessively formal meanings unless clearly defined in the present disclosure.

The electronic device according to one embodiment may be one of various types of electronic devices. The electronic devices may include, for example, a portable communication device (e.g., a smart phone), a computer, a portable multimedia device, a portable medical device, a camera, a wearable device, or a home appliance. According to one embodiment of the disclosure, an electronic device is not limited to those described above.

The terms used in the present disclosure are not intended to limit the present disclosure but are intended to include various changes, equivalents, or replacements for a corresponding embodiment. With regard to the descriptions of the accompanying drawings, similar reference numerals may be used to refer to similar or related elements. A singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, terms such as "1$^{st}$," "2nd," "first," and "second" may be used to distinguish a corresponding component from another component, but are not intended to limit the components in other aspects (e.g., importance or order). It is intended that if an element (e.g., a first element) is referred to, with or without the term "operatively" or "communicatively", as "coupled with," "coupled to," "connected with," or "connected to" another element (e.g., a second element), it indicates that the element may be coupled with the other element directly (e.g., wired), wirelessly, or via a third element.

As used herein, the term "module" may include a unit implemented in hardware, software, or firmware, and may interchangeably be used with other terms, for example, "logic," "logic block," "part," and "circuitry." A module may be a single integral component, or a minimum unit or part thereof, adapted to perform one or more functions. For example, according to one embodiment, a module may be implemented in a form of an application-specific integrated circuit (ASIC).

Figure 1:
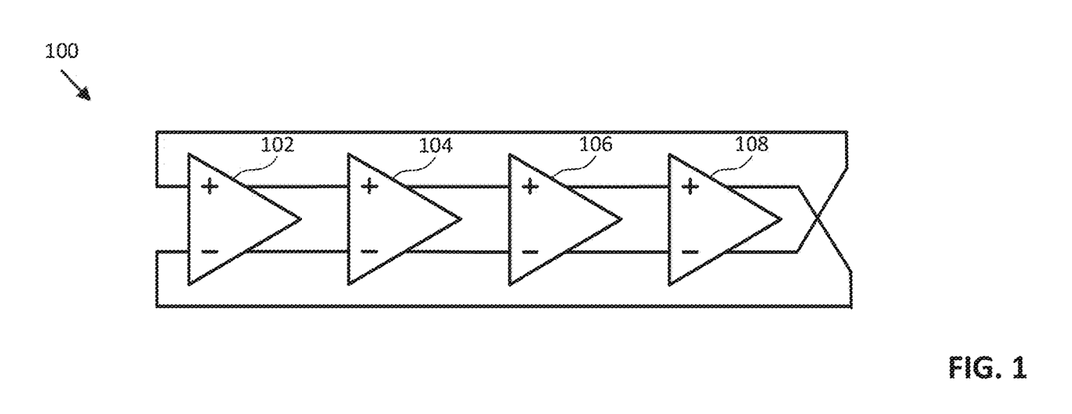
FIG. 1 illustrates a diagram of a traditional four-stage differential ring VCO.

FIG. 1 illustrates a diagram of a traditional four-stage differential ring VCO. The ring VCO 100 includes four differential stages 102, 104, 106 and 108 that are connected together to form a feedback loop.

Figure 2:
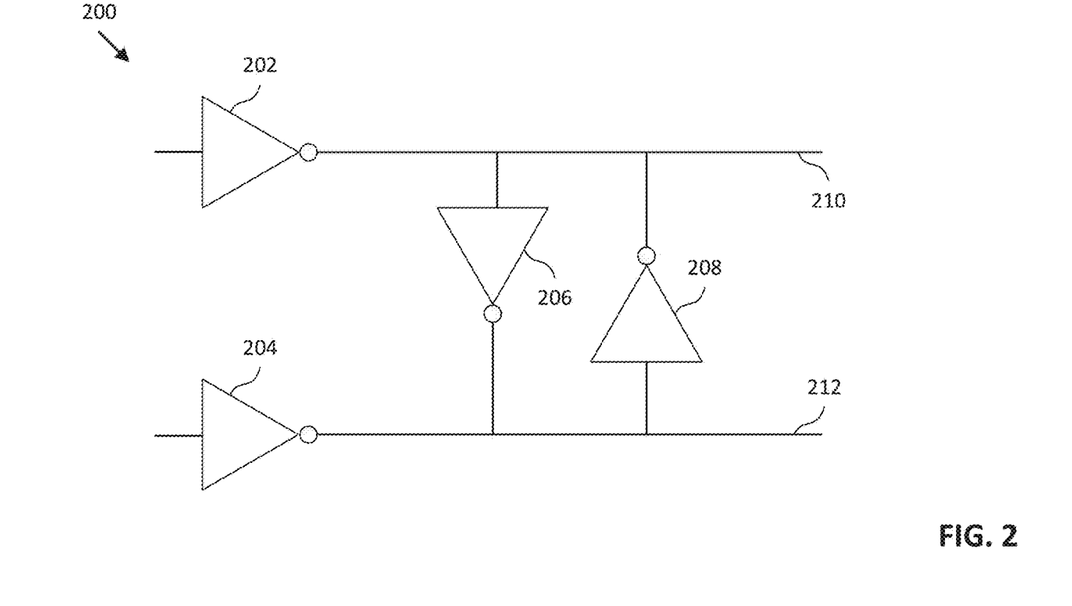
FIG. 2 illustrates a diagram of a differential stage in a differential ring VCO.

FIG. 2 illustrates a diagram of a differential stage in a ring VCO. In each differential stage (e.g., differential stages 102, 104, 106 and 108 of FIG. 1), inverter 202 and inverter 204 (e.g., a first inverter and a second inverter) are the main inverters and inverter 206 and inverter 208 (e.g., a third inverter and a fourth inverter) are the auxiliary inverters used to keep the outputs 210 and 212 of each differential stage.

Figure 3:
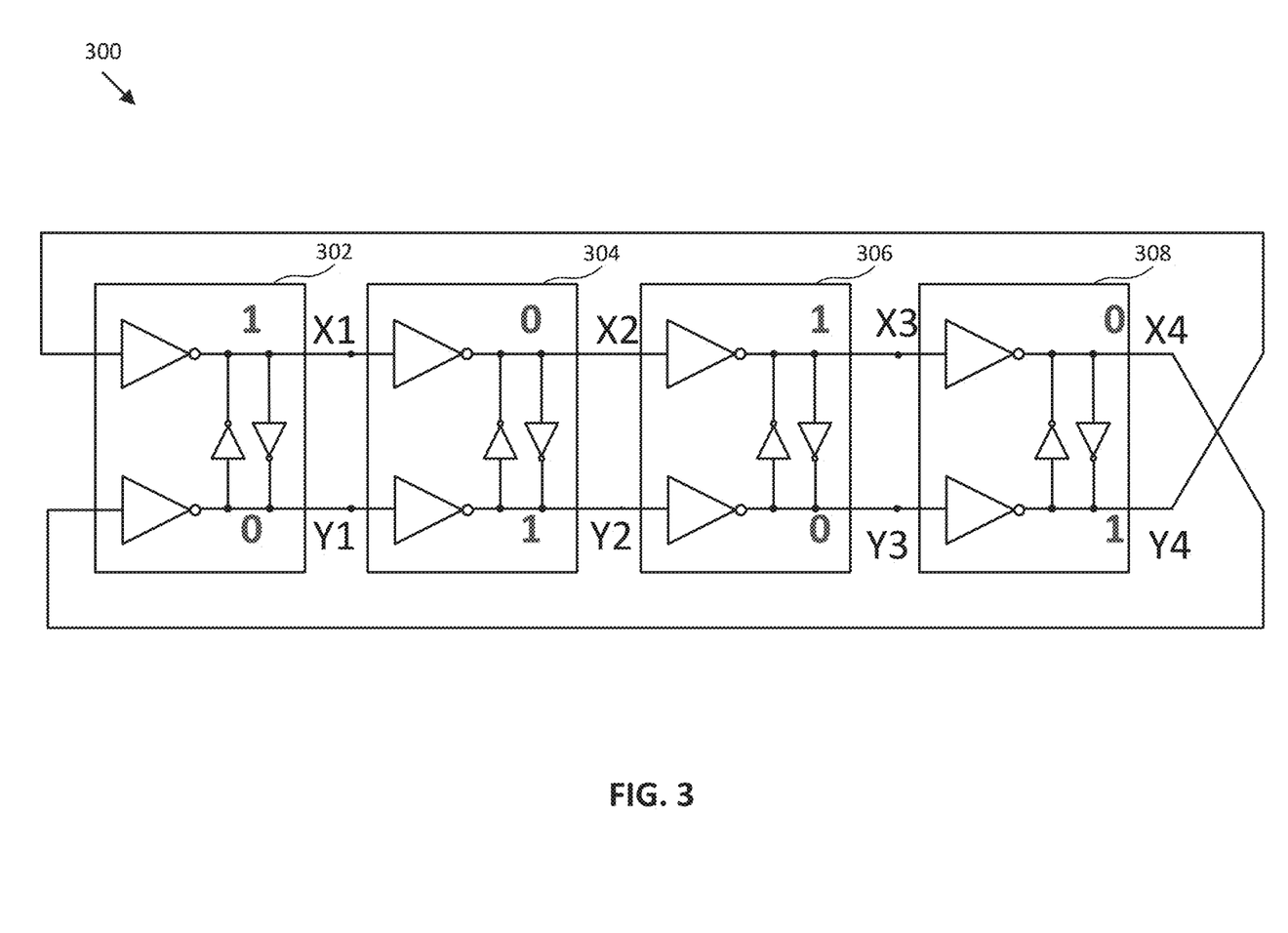
FIG. 3 illustrates a diagram of a four-stage differential ring VCO.

FIG. 3 illustrates a diagram of a four-stage differential ring VCO. The ring VCO 300 includes differential stages 302, 304, 306 and 308, each stage including inverters such as those depicted in FIG. 2 (e.g., "stage 302, 304, 306 and 308 are depicted similarly as the stages shown in FIG. 2"). If the node X1 of stage 302 is "1", due to the main inverter in the next stage 304, node X2 will be "0". Due to the auxiliary inverters, node Y1 will be "0", and a similar operation is performed down the oscillator. Thus, for each stage's output (X1/Y1, X2/Y2, X3/Y3 and X4/Y4), the output if differential (i.e., one output is "1" and one output is "0"). Note that "1" indicates the voltage close to the supply voltage of the ring VCO 300, not necessarily 1 V.

Typically, the ratio of main inverters to auxiliary inverters is larger than 4 to 1. If the auxiliary inverters are sized to be large, the differential operation is well maintained by the strong auxiliary inverters, but the auxiliary inverters add a load to the main inverters and lower the oscillator frequency. The auxiliary inverters may also cause large power consumption. However, if the auxiliary inverters are sized to be small, the differential operation is broken and the outputs of a single stage are the same. Each stage's output (X1/Y1, X2/Y2, X3/Y3 and X4/Y4) is the same at each stage. In other words, X1 and Y1 are "0" X2 and Y2 are "1", X3 and Y3 are "0", and X4 and Y4 are "1". Alternatively, X1 and Y1 may be "1", X2 and Y2 may be "0", X3 and Y3 may be "1", and X4 and Y4 may be "0". The oscillation cannot start since the node forms a positive feedback and the entire circuit is latched up. To get the VCO out of the stuck condition, several starter helper circuits are disclosed herein.

Figure 4:
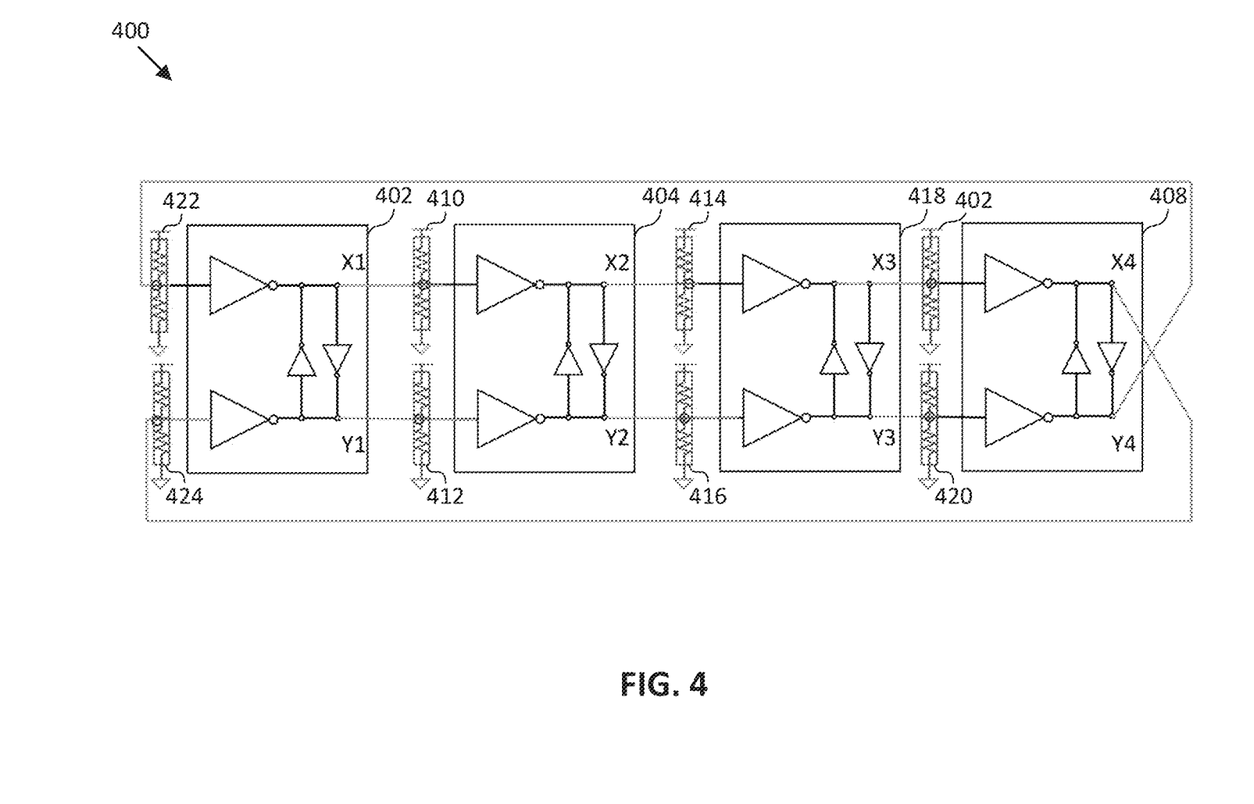
FIG. 4 illustrates a diagram of a differential ring VCO having a startup helper circuit, according to one embodiment.

FIG. 4 illustrates a diagram of a differential ring VCO having a startup helper circuit, according to one embodiment. A VCO 400 includes a first stage 402, a second stage 404, a third stage 406 and a fourth stage 408. Each VCO node (e.g., X1/Y1) is coupled with a corresponding pair of biasing resistors (e.g., resistor 410 and 412 for node X1 and Y1, respectively, resistor 414 and 416 for node X2 and Y2, respectively, resistor 418 and 420 for node X3 and Y3, respectively, and resistor 422 and 424 for node X4 and Y4, respectively). The resistors are relatively large and are connected to the supply voltage (e.g., VDD) and the ground to provide a bias close to half of the supply voltage (e.g., VDD/2) to the internal nodes (e.g., X1, Y1, X2, Y2, X3, Y3, X4 and Y4). This helps the internal nodes converge to a midpoint around half the supply voltage where the gain of the auxiliary inverter is highest and can help maintain differential operation.

Figure 5:
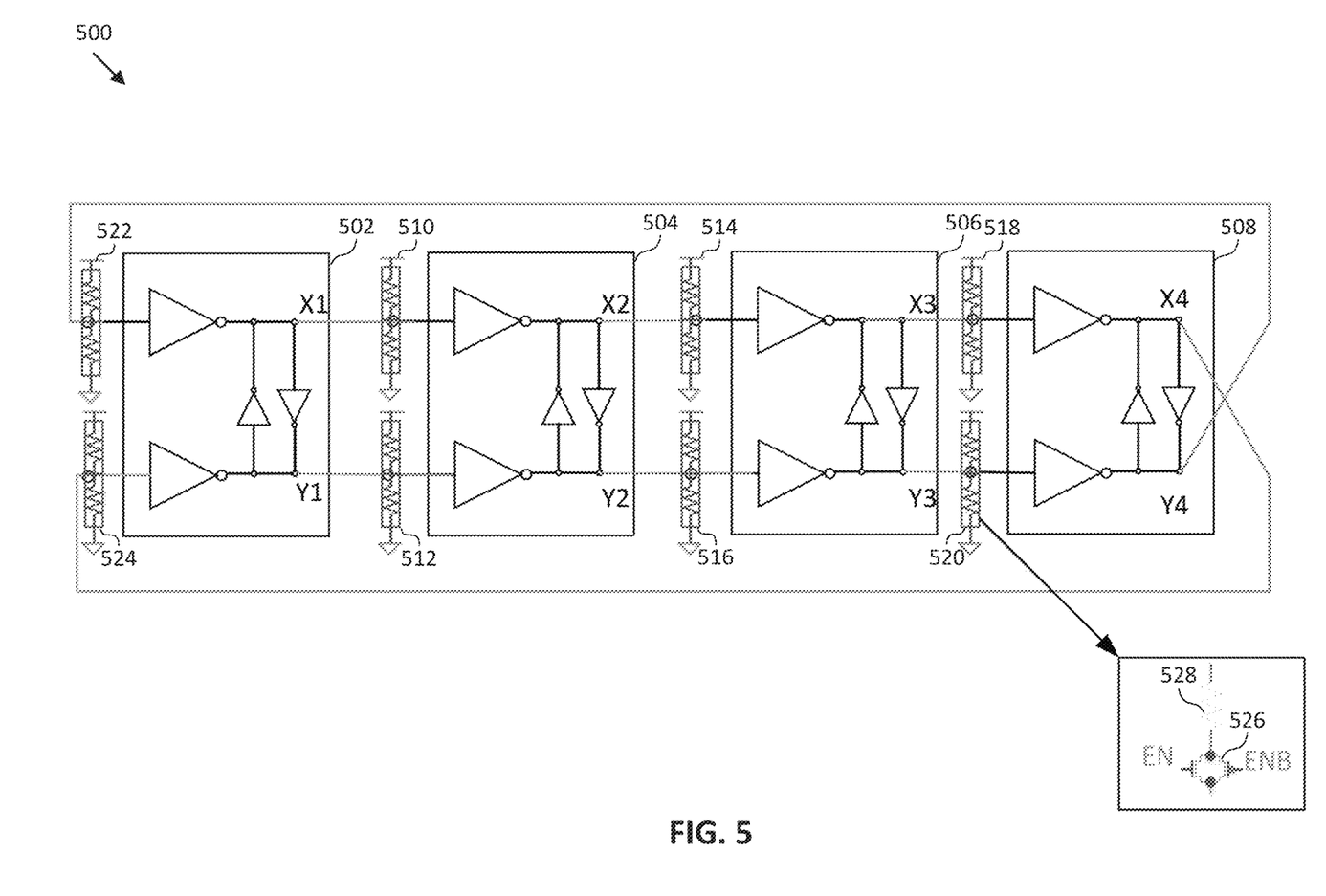
FIG. 5 illustrates a diagram of another differential ring VCO having a startup helper circuit, according to one embodiment.

FIG. 5 illustrates a diagram of another differential ring VCO having a startup helper circuit, according to one embodiment. A VCO 500 includes a first stage 502, a second stage 504, a third stage 506 and a fourth stage 508. Each VCO node (e.g., X1/Y1) is coupled with a corresponding pair of biasing resistors (e.g., resistor 510 and 512 for node X1 and Y1, respectively, resistor 514 and 516 for node X2 and Y2, respectively, resistor 518 and 520 for node X3 and Y3, respectively, and resistor 522 and 524 for node X4 and Y4, respectively). Some or all of the resistors may be modified to include a switch 516 to be able to power the resistors off. The EN signal is used to enable the biasing resistor 528 and can be set to a low value (e.g., close to or about 0) after the VCO 500 successfully starts.

Figure 6:
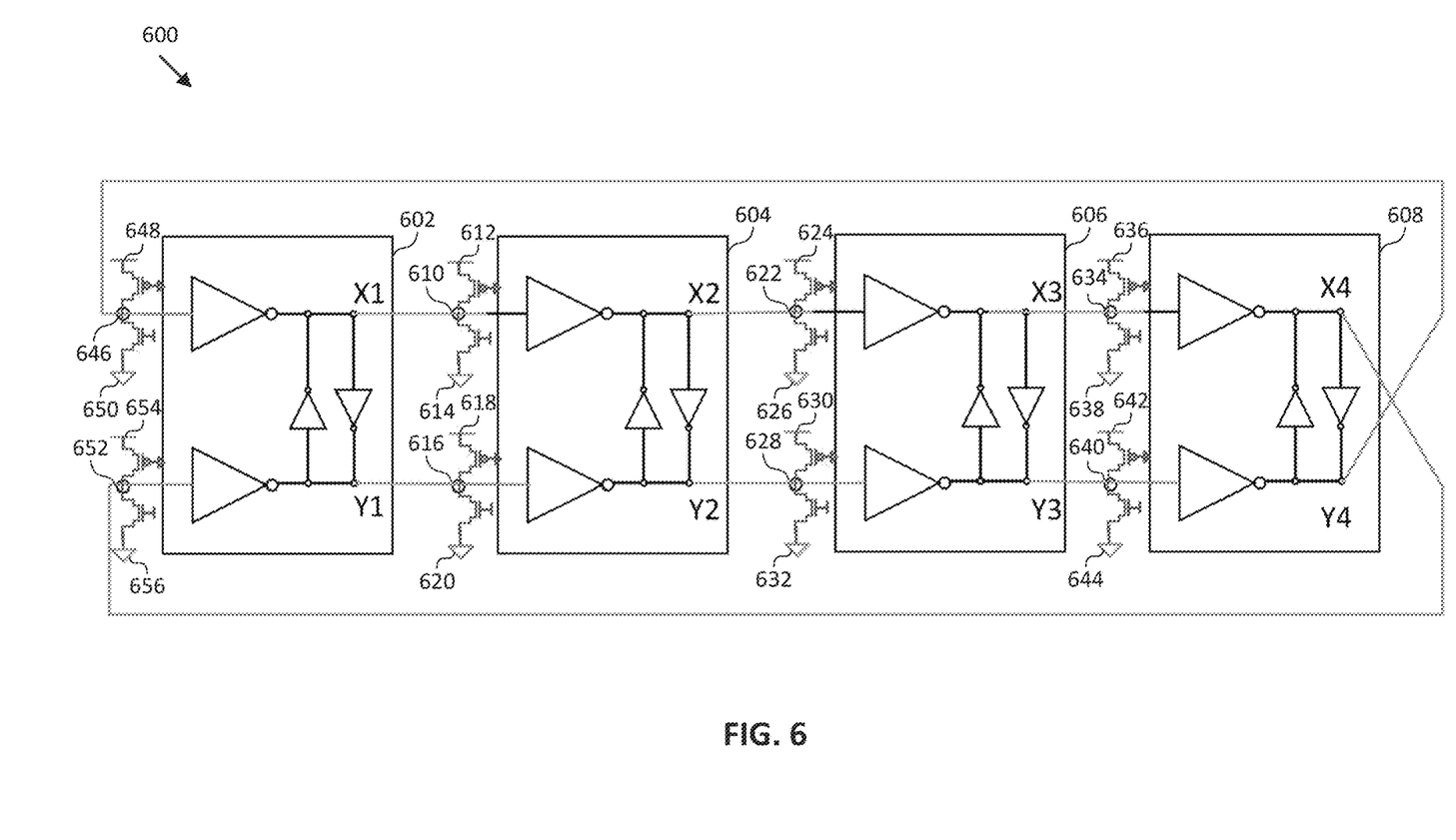
FIG. 6 illustrates a diagram of another differential ring VCO having a startup helper circuit, according to one embodiment.

FIG. 6 illustrates a diagram of another differential ring VCO having a startup helper circuit, according to one embodiment. A VCO 600 includes a first stage 602, a second stage 604, a third stage 606 and a fourth stage 608. The physical resistor made with poly-resistor in a silicon process may be bulky in the layout, thus large resistors such as those larger than 10K ohms are not feasible in a compact VCO layout. Thus, the VCO 600 replaces the poly-resistors with metal-oxide semiconductors (MOSs) (e.g., p-type MOS (PMOS) and n-type MOS (NMOS). For example, in the MOS 610, the PMOS 612 with the gate ties to the ground and the NMOS 614 with the gate ties to the supply voltage for the X1 node and are used to provide a resistance similar to the biasing resistors. In the MOS 616, the PMOS 618 with the gate ties to the ground and the NMOS 620 with the gate ties to the supply voltage for the Y1 node and are used to provide a resistance similar to the biasing resistors. In the MOS 622, the PMOS 624 with the gate ties to the ground and the NMOS 626 with the gate ties to the supply voltage for the X2 node and are used to provide a resistance similar to the biasing resistors. In the MOS 628, the PMOS 630 with the gate ties to the ground and the NMOS 632 with the gate ties to the supply voltage for the Y2 node and are used to provide a resistance similar to the biasing resistors. In the MOS 634, the PMOS 636 with the gate ties to the ground and the NMOS 638 with the gate ties to the supply voltage for the X3 node and are used to provide a resistance similar to the biasing resistors. In the MOS 640, the PMOS 642 with the gate ties to the ground and the NMOS 644 with the gate ties to the supply voltage for the Y3 node and are used to provide a resistance similar to the biasing resistors. In the MOS 646, the PMOS 648 with the gate ties to the ground and the NMOS 650 with the gate ties to the supply voltage for the X4 node and are used to provide a resistance similar to the biasing resistors. In the MOS 652, the PMOS 654 with the gate ties to the ground and the NMOS 656 with the gate ties to the supply voltage for the Y4 node and are used to provide a resistance similar to the biasing resistors. The size, width and length of the PMOS and NMOS may vary to achieve the desired equivalent resistance.

Figure 7:
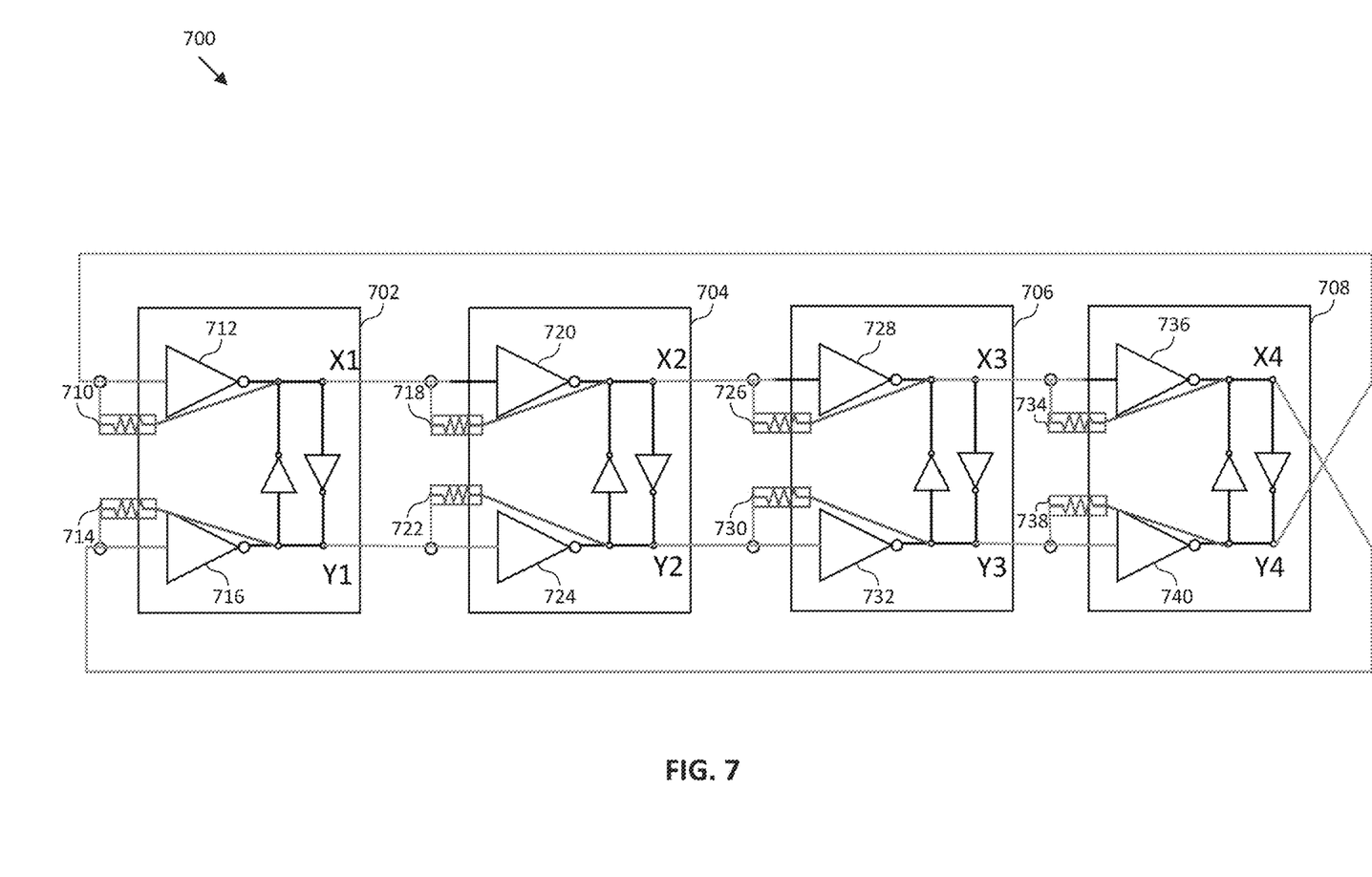
FIG. 7 illustrates a diagram of another differential ring VCO having a startup helper circuit, according to one embodiment.

FIG. 7 illustrates a diagram of another differential ring VCO having a startup helper circuit, according to one embodiment. A VCO 700 includes a first stage 702, a second stage 704, a third stage 706 and a fourth stage 708. A resistor 710 is connected between the input and output of the inverter 712, providing a resisting bias for node X1 and a resistor 716 is connected between the input and the output of the inverter 718, providing a resisting bias for node Y1. A resistor 718 is connected between the input and output of the inverter 720, providing a resisting bias for node X2 and a resistor 722 is connected between the input and the output of the inverter 724, providing a resisting bias for node Y2. A resistor 726 is connected between the input and output of the inverter 728, providing a resisting bias for node X3 and a resistor 730 is connected between the input and the output of the inverter 732, providing a resisting bias for node Y3. A resistor 734 is connected between the input and output of the inverter 736, providing a resisting bias for node X4 and a resistor 738 is connected between the input and the output of the inverter 740, providing a resisting bias for node Y4, The inverter is self-biased close to half the supply voltage. The VCO 700 solves the issue of startup since the self-biasing resistors provide a bias of close to half the supply voltage to the internal nodes to help the internal nodes converge to a midpoint around half the supply voltage, where the gain of the auxiliary inverter is highest and can help maintain differential operations.

Figure 8:
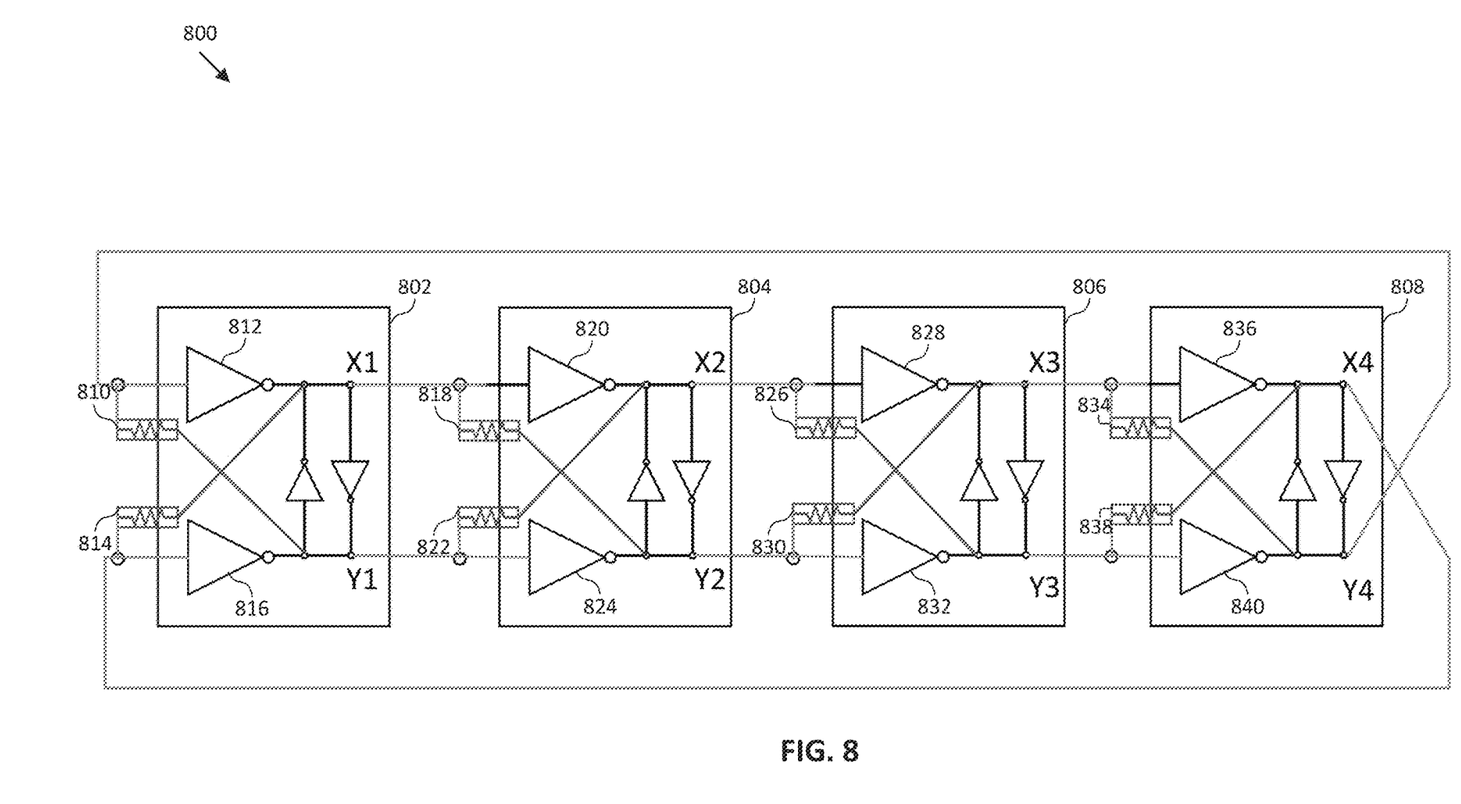
FIG. 8 illustrates a diagram of another differential ring VCO having a startup helper circuit, according to one embodiment.

FIG. 8 illustrates a diagram of another differential ring VCO having a startup helper circuit, according to one embodiment. A VCO 800 includes a first stage 802, a second stage 804, a third stage 806 and a fourth stage 808. A resistor 810 is connected between the input of inverter 812 and the output of the inverter 816, providing a resisting bias for node Y1 and a resistor 814 is connected between the input of the inverter 816 and the output of the inverter 812, providing a resisting bias for node X1. A resistor 818 is connected between the input of inverter 820 and the output of the inverter 824, providing a resisting bias for node Y2 and a resistor 822 is connected between the input of the inverter 824 and the output of the inverter 820, providing a resisting bias for node X2. A resistor 826 is connected between the input of inverter 828 and the output of the inverter 832, providing a resisting bias for node Y3 and a resistor 830 is connected between the input of the inverter 832 and the output of the inverter 828, providing a resisting bias for node X3. A resistor 834 is connected between the input of inverter 836 and the output of the inverter 840, providing a resisting bias for node Y4, and a resistor 838 is connected between the input of the inverter 840 and the output of the inverter 836, providing a resisting bias for node X4. Similar connections are made with the second stage 804, third stage 806 and fourth stage 808.

Figure 9:
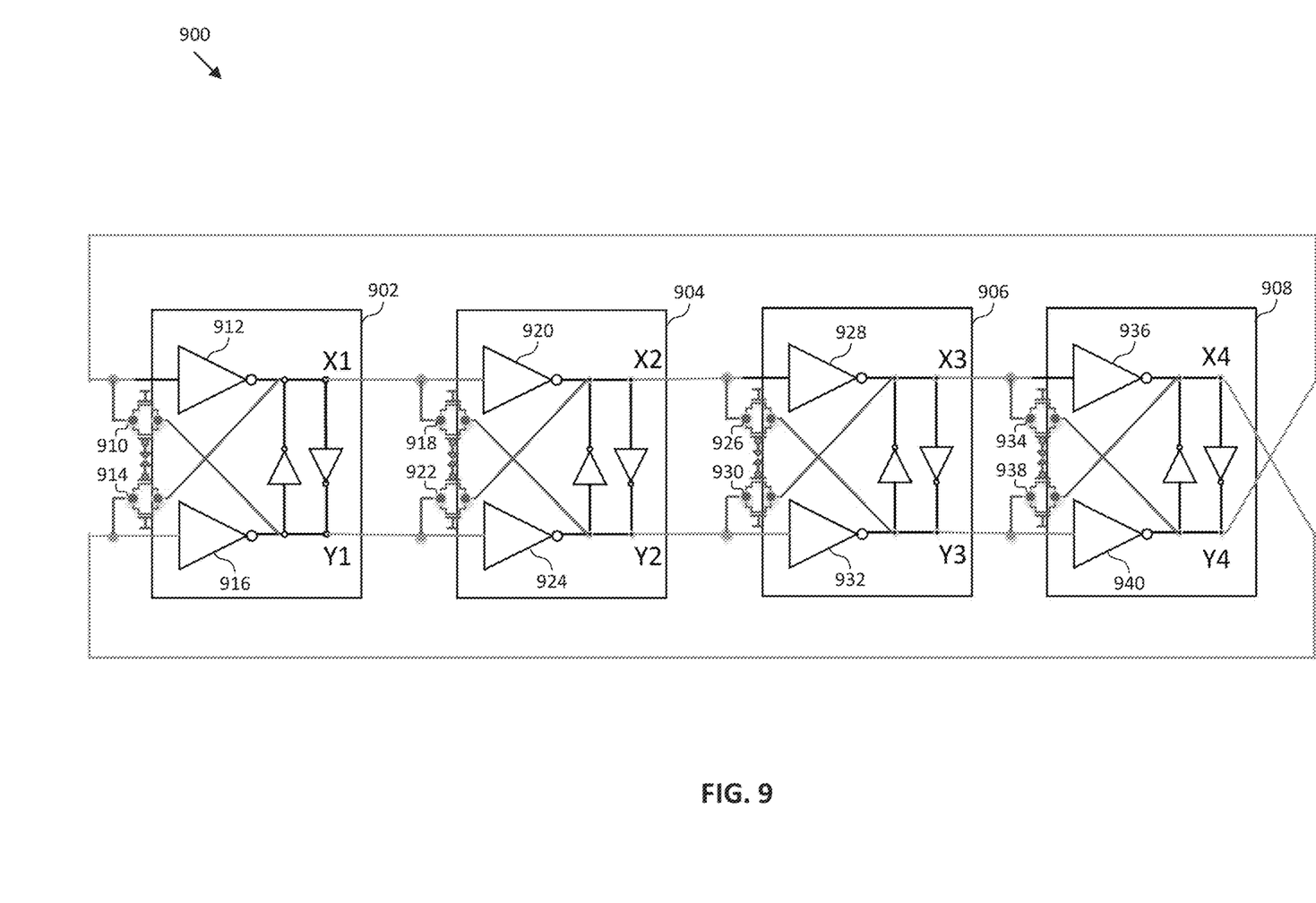
FIG. 9 illustrates a diagram of another differential ring VCO having a startup helper circuit, according to one embodiment.

FIG. 9 illustrates a diagram of another differential ring VCO having a startup helper circuit, according to one embodiment. A VCO 900 includes a first stage 902, a second stage 904, a third stage 906 and a fourth stage 908. A PMOS/NMOS pair 910 is connected between the input of inverter 912 and the output of the inverter 916, providing a resisting bias for node Y1 and a PMOS/NMOS pair 914 is connected between the input of the inverter 916 and the output of the inverter 912, providing a resisting bias for node X1. A PMOS/NMOS pair 918 is connected between the input of inverter 920 and the output of the inverter 924, providing a resisting bias for node Y2 and a PMOS/NMOS pair 922 is connected between the input of the inverter 920 and the output of the inverter 924, providing a resisting bias for node X2. A PMOS/NMOS pair 926 is connected between the input of inverter 928 and the output of the inverter 932, providing a resisting bias for node Y3 and a PMOS/NMOS pair 930 is connected between the input of the inverter 932 and the output of the inverter 928, providing a resisting bias for node X3. A PMOS/NMOS pair 934 is connected between the input of inverter 936 and the output of the inverter 940, providing a resisting bias for node Y4 and a PMOS/NMOS pair 938 is connected between the input of the inverter 940 and the output of the inverter 936, providing a resisting bias for node X4. The PMOS gates may be connected to the ground and the NMOS gates may be connected to the supply voltage. The size, width and length of the PMOS and the NMOS may vary as will be understood to those of skill in the art.

Figure 10:
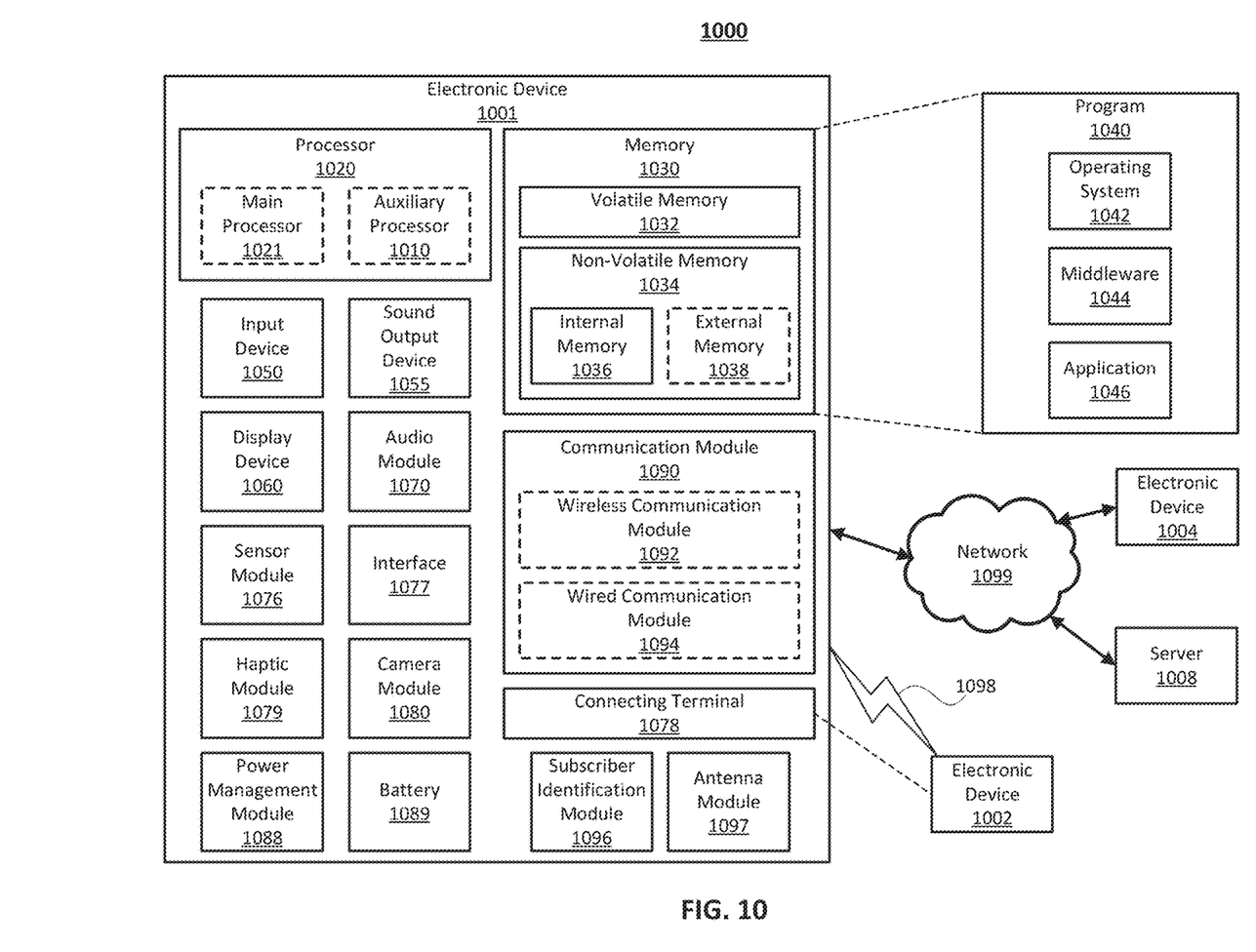
FIG. 10 illustrates a block diagram of an electronic device in a network environment, according to one embodiment.

FIG. 10 illustrates a block diagram of an electronic device 1001 in a network environment 1000, according to one embodiment. Referring to FIG. 10, the electronic device 1001 in the network environment 1000 may communicate with another electronic device 1002 via a first network 1098 (e.g., a short-range wireless communication network), or another electronic device 1004 or a server 1008 via a second network 1099 (e.g., a long-range wireless communication network). The electronic device 1001 may also communicate with the electronic device 1004 via the server 1008. The electronic device 1001 may include a processor 1020, a memory 1030, an input device 1050, a sound output device 1055, a display device 1060, an audio module 1070, a sensor module 1076, an interface 1077, a haptic module 1079, a camera module 1080, a power management module 1088, a battery 1089, a communication module 1090, a subscriber identification module (SIM) 1096, or an antenna module 1097. In one embodiment, at least one (e.g., the display device 1060 or the camera module 1080) of the components may be omitted from the electronic device 1001, or one or more other components may be added to the electronic device 1001. In one embodiment, some of the components may be implemented as a single integrated circuit (IC). For example, the sensor module 1076 (e.g., a fingerprint sensor, an iris sensor, or an illuminance sensor) may be embedded in the display device 1060 (e.g., a display).

The processor 1020 may execute, for example, software (e.g., a program 1040) to control at least one other component (e.g., a hardware or a software component) of the electronic device 1001 coupled with the processor 1020, and may perform various data processing or computations. As at least part of the data processing or computations, the processor 1020 may load a command or data received from another component (e.g., the sensor module 1076 or the communication module 1090) in volatile memory 1032, process the command or the data stored in the volatile memory 1032, and store resulting data in non-volatile memory 1034. The processor 1020 may include a main processor 1021 (e.g., a central processing unit (CPU) or an application processor (AP)), and an auxiliary processor 1023 (e.g., a graphics processing unit (GPU), an image signal processor (ISP), a sensor hub processor, or a communication processor (CP)) that is operable independently from, or in conjunction with, the main processor 1021. Additionally or alternatively, the auxiliary processor 1023 may be adapted to consume less power than the main processor 1021, or execute a particular function. The auxiliary processor 1023 may be implemented as being separate from, or a part of, the main processor 1021.

The auxiliary processor 1023 may control at least some of the functions or states related to at least one component (e.g., the display device 1060, the sensor module 1076, or the communication module 1090) among the components of the electronic device 1001, instead of the main processor 1021 while the main processor 1021 is in an inactive (e.g., sleep) state, or together with the main processor 1021 while the main processor 1021 is in an active state (e.g., executing an application). According to one embodiment, the auxiliary processor 1023 (e.g., an ISP or a CP) may be implemented as part of another component (e.g., the camera module 1080 or the communication module 1090) functionally related to the auxiliary processor 1023.

The memory 1030 may store various data used by at least one component (e.g., the processor 1020 or the sensor module 1076) of the electronic device 1001. The various data may include, for example, software (e.g., the program 1040) and input data or output data for a command related thereto. The memory 1030 may include the volatile memory 1032 or the non-volatile memory 1034.

The program 1040 may be stored in the memory 1030 as software, and may include, for example, an operating system (OS) 1042, middleware 1044, or an application 1046.

The input device 1050 may receive a command or data to be used by other component (e.g., the processor 1020) of the electronic device 1001, from the outside (e.g., a user) of the electronic device 1001. The input device 1050 may include, for example, a microphone, a mouse, or a keyboard.

The sound output device 1055 may output sound signals to the outside of the electronic device 1001. The sound output device 1055 may include, for example, a speaker or a receiver. The speaker may be used for general purposes, such as playing multimedia or recording, and the receiver may be used for receiving an incoming call. According to one embodiment, the receiver may be implemented as being separate from, or a part of, the speaker.

The display device 1060 may visually provide information to the outside (e.g., a user) of the electronic device 1001. The display device 1060 may include, for example, a display, a hologram device, or a projector and control circuitry to control a corresponding one of the display, hologram device, and projector. According to one embodiment, the display device 1060 may include touch circuitry adapted to detect a touch, or sensor circuitry (e.g., a pressure sensor) adapted to measure the intensity of force incurred by the touch.

The audio module 1070 may convert a sound into an electrical signal and vice versa. According to one embodiment, the audio module 1070 may obtain the sound via the input device 1050, or output the sound via the sound output device 1055 or a headphone of an external electronic device 1002 directly (e.g., wired) or wirelessly coupled with the electronic device 1001.

The sensor module 1076 may detect an operational state (e.g., power or temperature) of the electronic device 1001 or an environmental state (e.g., a state of a user) external to the electronic device 1001, and then generate an electrical signal or data value corresponding to the detected state. The sensor module 1076 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1077 may support one or more specified protocols to be used for the electronic device 1001 to be coupled with the external electronic device 1002 directly (e.g., wired) or wirelessly. According to one embodiment, the interface 1077 may include, for example, a high definition multimedia interface (HDMI), a universal serial bus (USB) interface, a secure digital (SD) card interface, or an audio interface.

A connecting terminal 1078 may include a connector via which the electronic device 1001 may be physically connected with the external electronic device 1002. According to one embodiment, the connecting terminal 1078 may include, for example, an HDMI connector, a USB connector, an SD card connector, or an audio connector (e.g., a headphone connector).

The haptic module 1079 may convert an electrical signal into a mechanical stimulus (e.g., a vibration or a movement) or an electrical stimulus which may be recognized by a user via tactile sensation or kinesthetic sensation. According to one embodiment, the haptic module 1079 may include, for example, a motor, a piezoelectric element, or an electrical stimulator.

The camera module 1080 may capture a still image or moving images. According to one embodiment, the camera module 1080 may include one or more lenses, image sensors, ISPs, or flashes.

The power management module 1088 may manage power supplied to the electronic device 1001. The power management module 1088 may be implemented as at least part of, for example, a power management integrated circuit (PMIC).

The battery 1089 may supply power to at least one component of the electronic device 1001. According to one embodiment, the battery 1089 may include, for example, a primary cell which is not rechargeable, a secondary cell which is rechargeable, or a fuel cell.

The communication module 1090 may support establishing a direct (e.g., wired) communication channel or a wireless communication channel between the electronic device 1001 and the external electronic device (e.g., the electronic device 1002, the electronic device 1004, or the server 1008) and performing communication via the established communication channel. The communication module 1090 may include one or more communication processors that are operable independently from the processor 1020 (e.g., the AP) and supports a direct (e.g., wired) communication or a wireless communication. According to one embodiment, the communication module 1090 may include a wireless communication module 1092 (e.g., a cellular communication module, a short-range wireless communication module, or a global navigation satellite system (GNSS) communication module) or a wired communication module 1094 (e.g., a local area network (LAN) communication module or a power line communication (PLC) module). A corresponding one of these communication modules may communicate with the external electronic device via the first network 1098 (e.g., a short-range communication network, such as Bluetooth™, wireless-fidelity (Wi-Fi) direct, or a standard of the Infrared Data Association (IrDA)) or the second network 1099 (e.g., a long-range communication network, such as a cellular network, the Internet, or a computer network (e.g., LAN or wide area network (WAN)). These various types of communication modules may be implemented as a single component (e.g., a single IC), or may be implemented as multiple components (e.g., multiple ICs) that are separate from each other. The wireless communication module 1092 may identify and authenticate the electronic device 1001 in a communication network, such as the first network 1098 or the second network 1099, using subscriber information (e.g., international mobile subscriber identity (IMSI)) stored in the subscriber identification module 1096.

The antenna module 1097 may transmit or receive a signal or power to or from the outside (e.g., the external electronic device) of the electronic device 1001. According to one embodiment, the antenna module 1097 may include one or more antennas, and, therefrom, at least one antenna appropriate for a communication scheme used in the communication network, such as the first network 1098 or the second network 1099, may be selected, for example, by the communication module 1090 (e.g., the wireless communication module 1092). The signal or the power may then be transmitted or received between the communication module 1090 and the external electronic device via the selected at least one antenna.

At least some of the above-described components may be mutually coupled and communicate signals (e.g., commands or data) therebetween via an inter-peripheral communication scheme (e.g., a bus, a general purpose input and output (GPIO), a serial peripheral interface (SPI), or a mobile industry processor interface (MIPI)).

According to one embodiment, commands or data may be transmitted or received between the electronic device 1001 and the external electronic device 1004 via the server 1008 coupled with the second network 1099. Each of the electronic devices 1002 and 1004 may be a device of a same type as, or a different type, from the electronic device 1001. All or some of operations to be executed at the electronic device 1001 may be executed at one or more of the external electronic devices 1002, 1004, or 1008. For example, if the electronic device 1001 should perform a function or a service automatically, or in response to a request from a user or another device, the electronic device 1001, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1001. The electronic device 1001 may provide the outcome, with or without further processing of the outcome, as at least part of a reply to the request. To that end, a cloud computing, distributed computing, or client-server computing technology may be used, for example.

One embodiment may be implemented as software (e.g., the program 1040) including one or more instructions that are stored in a storage medium (e.g., internal memory 1036 or external memory 1038) that is readable by a machine (e.g., the electronic device 1001). For example, a processor of the electronic device 1001 may invoke at least one of the one or more instructions stored in the storage medium, and execute it, with or without using one or more other components under the control of the processor. Thus, a machine may be operated to perform at least one function according to the at least one instruction invoked. The one or more instructions may include code generated by a complier or code executable by an interpreter. A machine-readable storage medium may be provided in the form of a non-transitory storage medium. The term "non-transitory" indicates that the storage medium is a tangible device, and does not include a signal (e.g., an electromagnetic wave), but this term does not differentiate between where data is semi-permanently stored in the storage medium and where the data is temporarily stored in the storage medium.

According to one embodiment, a method of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to one embodiment, each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In this case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. A ring voltage controlled oscillator (VCO) circuit, comprising:
    a first stage including a first inverter, a second inverter, a third inverter and a fourth inverter, the first inverter of the first stage connected in parallel with the third and fourth inverters of the first stage and the second inverter of the first stage connected in parallel with the third and fourth inverters of the first stage;
    a second stage connected in series with the first stage, the second stage including a first inverter, a second inverter, a third inverter and a fourth inverter, the first inverter of the second stage connected in parallel with the third and fourth inverters of the second stage and the second inverter of the second stage connected in parallel with the third and fourth inverters of the second stage;
    a first biasing resistor directly connected to an input of the first inverter of the first stage and an output of the second inverter of the first stage, providing a resisting bias associated with a node of the second inverter of the first stage;
    a second biasing resistor directly connected to an input of the second inverter of the first stage and an output of the first inverter of the first stage, providing a resisting bias associated with a node the first inverter of the first stage;
    a third biasing resistor directly connected to an input of the first inverter of the second stage and an output of the second inverter of the second stage, providing a resisting bias associated with a node of the second inverter of the second stage; and
    a fourth biasing resistor directly connected to an input of the second inverter of the second stage and an output of the first inverter of the second stage, providing a resisting bias associated with a node the first inverter of the second stage,
    wherein the first and second inverter of the first stage are sized larger than the third and fourth inverter of the first stage, and
    wherein the first and second inverter of the second stage are sized larger than the third and fourth inverter of the second stage.

2. The ring VCO circuit of claim 1, wherein the first biasing resistor comprises a metal-oxide semiconductor (MOS).

3. The ring VCO circuit of claim 2, wherein the first biasing resistor comprises a p-type MOS (PMOS)/n-type (NMOS) pair.

4. The ring VCO circuit of claim 1, wherein the second biasing resistor comprises a PMOS/NMOS pair.

* * * * *